United States Patent [19]
Ohshima

[11] Patent Number: 5,198,879
[45] Date of Patent: Mar. 30, 1993

[54] HETEROJUNCTION SEMICONDUCTOR DEVICE

[75] Inventor: Toshio Ohshima, Atsugi, Japan

[73] Assignee: Fujitsu Limited, Kanagawa, Japan

[21] Appl. No.: 672,025

[22] Filed: Mar. 19, 1991

[30] Foreign Application Priority Data

Mar. 19, 1990 [JP] Japan ................... 2-68740
Sep. 20, 1990 [JP] Japan ................... 2-250679

[51] Int. Cl.⁵ ............................................. H01L 29/80
[52] U.S. Cl. .................................. 257/20; 257/17; 257/24; 257/425
[58] Field of Search ............. 357/22 A, 22 MD, 16, 357/22 I, 23.2, 27

[56] References Cited

U.S. PATENT DOCUMENTS

| | | | |
|---|---|---|---|
| 4,488,164 | 12/1984 | Kazarinov et al. | 357/27 |
| 4,550,330 | 10/1985 | Fowler | 357/20 |
| 4,825,264 | 4/1989 | Inata et al. | 357/16 |
| 4,912,531 | 3/1990 | Reed et al. | 357/16 |
| 4,974,036 | 11/1990 | Kapon | 357/16 |
| 4,977,435 | 12/1990 | Yoshimura et al. | 357/23.5 |

FOREIGN PATENT DOCUMENTS 63-316481 12/1988 Japan ................... 357/22 A

Primary Examiner—Andrew J. James
Assistant Examiner—Sara W. Crane
Attorney, Agent, or Firm—Staas & Halsey

[57] ABSTRACT

A heterojunction semiconductor device utilizing a quantum-mechanical effect comprises a first compound semiconductor (e.g., AlGaAs) layer and a second compound semiconductor (e.g., GaAs) layer having an electron affinity different from that of the first semiconductor layer, and the first and second compound semiconductor layers forming a heterojunction interface therebetween, the first layer having an energy at the conduction band bottom thereof higher than that of the second layer and doped with donor impurities, wherein at least one concave or convex portion of the first semiconductor layer is formed at the heterojunction interface and both sides of the concave or convex portion serve as a potential well or potential barriers against electrons accumulated in the second semiconductor layer close to the vicinity of the heterojunction interface.

12 Claims, 14 Drawing Sheets

$K_x < K_{MIN}$ $K_{MIN} < K_x < K_{MAX}$

HETEROJUNCTION SEMICONDUCTOR DEVICE

BACKGROUND OF THE INVENTION

1. Field of the Invention

The present invention relates to a semi-conductor device, and more particularly, to a compound semiconductor device with a heterojunction.

2. Description of the Related Art

Recent developments in crystal growth techniques have made it possible to obtain a superior semiconductor heterojunction, and thus an abrupt change and a flatness at a heterojunction interface between a compound semiconductor layer and another compound semiconductor layer can be controlled at a monoatomic layer level. For example, a HEMT (High Electron Mobility Transistor) using a single heterojunction of III-V group compound layers has been realized.

In addition to the HEMT, a HET (Hot-Electron Transistor) and a RHET (Resonant Tunneling Hot Transistor) and the like, which use a carrier movement in a direction perpendicular to the heterojunction interface, have been studied and developed, and further, other semiconductor devices utilizing a quantum-mechanical effect are now being studied and developed. These devices try to realize new functions or higher speed operations.

A basic semiconductor device element using a conventional resonant tunneling effect is now explained, using a conventional resonant tunnel diode shown in FIGS. 1a and 1b and FIG. 2 as an example.

As shown in FIG. 1a, using an MBE (Molecular-Beam Epitaxy) method, an AlGaAs thin layer 102, a GaAs thin layer 104, an AlGaAs thin layer 106 and a GaAs layer 108 are epitaxially deposited (grown) on a GaAs layer 100 in sequence, to form heterojunction interfaces between the adjoining layers, and electrodes 110 and 112 are formed on the GaAs layers 100 and 108, respectively. A predetermined bias voltage is applied across the electrodes 110 and 112, and an ammeter A is connected in series between the power source and the electrode 112.

Since the energy of the conduction band edge of AlGaAs is higher than that of the conduction band edge of GaAs, as shown in FIG. 1b, the AlGaAs thin layers 102 and 106 form potential barriers, but where the thickness of the layers 102, 104 and 106 is very thin, the potential barriers of the AlGaAs thin layers become tunnel barriers, and the GaAs thin layer 104 sandwiched by the tunnel barriers forms a quantum well. In the quantum well, specific electron energies (wavelengths) are multi-reflected to provide a remarkable interference effect, with the result that the transmission coefficient (probability) of the tunnel barriers is increased and a resonant tunneling effect is demonstrated.

The resonant tunnel diode has the current-voltage (I-V) characteristics shown in FIG. 2 and causes an NDR (Negative Differential Resistance), which NDR is applied to a detection of submillimeter-waves (T. C. L. G. Sollner, et al.: Appl. Phys. Lett., 43 (6), 15 September (1983) 588-590), a Transistor (N. Yokoyama, et al.: Jan. J. Appl. Phys., 24 (11) November (1985) L853-L854) or the like. When a device utilizes the NDR, preferably an inclination of a broken line H in FIG. 2 is steeper and/or a peak-to-valley (PV) ratio is higher.

In studies of semiconductor devices having heterojunctions, a formation of minibands due to a limitation in one direction of the electron movement has been applied to various devices, in line with the semiconductor superlattice proposed by Esaki et al. Further, in addition to one-dimensional superlattice consisting of alternating ultra-thin layers, attempts have been made to use a two-dimensional superlattice and a three-dimensional superlattice, which further limit the degrees of freedom of the electron, as a channel of an FET (Field Effect Transistor) or as an active layer of a laser.

Furthermore, proposals have been made with regard to devices using a quantum-mechanical effect, e.g., an AB (Aharonov-Bohm) effect device. The AB effect is such that a quantum-mechanical electron phase is influenced by an electromagnetic potential. For example, an AB effect device has a conductor ring provided with two leads extended diametrically and connected to a source and a drain, respectively. In this device, an electron wave from the source is divided at the inlet of the ring, flows through the two halves (passes) of the ring, respectively, merge again at the outlet of the ring, and then flow through the other lead to the drain. A phase difference between the electron waves flowing in the two (different) passes of the ring depends on a magnetic flux passed through the inside of the ring or on a scalar potential applied to one of the passes of the ring. Therefore, a suitable control means for regulating the magnetic flux within the ring or the scalar potential on one of the two passes is provided, to a generate an electron wave interference effect due to the phase difference, by which a conductance between the source and drain can be controlled.

Accordingly, the AB effect device can be used as a switching element or as an amplifying element, and can operate at a very high speed, since only a very small variation of an input signal is required for controlling the device, compared with a conventional transistor. It is expected that the AB effect device can be applied to an ultra-high speed integrated circuit.

Nevertheless, a semiconductor device using the conventional resonant tunneling effect has a layer-piled structure (consisting of the AlGaAs thin layer 102, GaAs thin layer 104, and AlGaAs thin layer 106), and thus the AlGaAs thin layers 102 and 106 form two-dimensional potential barriers and the conduction electrons move three-dimensionally. In this case, among the three direction momentums of the conduction electrons, only the momentum component in a "x" direction perpendicular to the potential barrier is related to a tunneling probability.

Namely, where an energy difference (E=eV) is provided on both sides of a potential barrier, as shown in FIG. 3, when the conduction electrons have a Fermi level of "μ", the maximum value $K_{MAX}$ and the minimum values $K_{MIN}$ of a wave vector of conduction electrons tunneling through the barrier at the absolute zero are given by:

$$K_{MAX} = [2m\,\mu/h^2]^{\frac{1}{2}}$$

$$K_{MIN} = [2\,m(\mu - eV)/h^2]^{\frac{1}{2}}.$$

Therefore, a portion of the conduction carriers having the "x" direction wave vector contributing to the tunneling current is limited to $S(K_x)$ in the wave number space, as shown in FIGS. 4a and 4b (cf. R. B. Eloyd and D. G. Walmsley, J. Phys. C11, (1978) 4601). A bias varies to vary the radius of the inside sphere. The tunneling current J flowing through the potential barrier at absolute zero is given by:

$$J = dK_x \cdot 2e \cdot V_x(K_x) \cdot S(K_x) \cdot [S/4\pi^2] \times T(K_x)$$

where $T(K_x)$ is a tunneling probability, the integration is performed from $K_x=0$ to $K_x=K_{MAX}$, $V_x$ is the group velocity of the conduction electrons with the wave vector $K_x$, and S is the area of the barrier. The bias eV vary not only $T(K_x)$ but also $S(K_x)$. In this formula, a multiplication by $S(K_x)$ and an integration contribute an averaging effect, whereby the NDR in the I-V characteristic is lowered, although the tunneling probability has a sharp peak at a certain value of $K_x$. Namely, the resonant tunnel effect of the semiconductor element using this effect is weakened and remarkable NDR is not obtained. From another standpoint, an reason for improving the NDR characteristics including a PV (peak to valley) ratio is now explained in connection with a number of states of electron. If the tunneling probability is ignored, a number N of electron states which can tunnel an barrier in view of energy, is calculated by dividing a difference between a volume of n (n=3 or 2)-dimensional sphere having a radius of $k_{MAX}$ and that of n-dimensional sphere having a radius of $k_{MIN}$ by $(2\pi/L)^n$. At n=3, i.e., under three dimensions in a conventional resonant tunnel device, $$N_{MAX} = \frac{4}{3} \pi k_{MAX}^3 / \left(\frac{2\pi}{L}\right)^3$$

$$N_{MIN} = \frac{4}{3} \pi k_{MIN}^3 / \left(\frac{2\pi}{L}\right)^3$$

therefore $$N_3(eV) = N_{MAX} - N_{MIN}$$

$$= \frac{4}{3} \pi \frac{V_0}{(2\pi)^3} \left(\frac{\sqrt{2m}}{h}\right)^3 [E_F^{3/2} - (E_F - eV)^{3/2}]$$

Where $V_0$ is an n-dimensional volume of a semiconductor device.

At n=2, i.e., under twodimensions in the resonant tunnel devise according to the present invention, $$N_2(eV) = \pi \frac{V_0}{(2\pi)^2} \frac{2m}{h^2} eV$$

Therefore, the above-mentioned relationships can be illustrated, as shown in a graph of FIG. 5. As can be seen from FIG. 5, when the bias increases, the number N of tunnelable states in the three-dimension case increases more than that in the two-dimension case. In other words, the dimension number n is decreased from 3 to 2 to make dependency of the number N of tunnelable states on the bias smaller, with the result the PV ratio or the like are enlarged (improved).

It is still thought impossible to realize a semiconductor device having an artificial modulation of an electron band structure and an operation characteristic not attained by a conventional device, by using the two-dimensional and three-dimensional superlattice limiting the movements of the electron in not only one certain direction but also other directions. Accordingly, intensive studies into the realization of such a device must be made. Furthermore, to generate the quantum-mechanical interference effect of the AB effect device, it is necessary to form an extreme pass (conductor line) to thereby one-dimensionally restrict the electron movement. It is, however, difficult to attain a very narrow width of the pass by a conventional mesa-etching method, and thus a practical AB effect device has not been realized, and this is also a matter for intensive study.

SUMMARY OF THE INVENTION

An object of the present invention is to provide a heterojunction semiconductor device having a structure which is used in a resonant tunneling effect device to cause a remarkable resonant tunnel effect, is used for realizing a two-dimensional superlattice and a three-dimensional superlattice, to remarkably improve the functions of various semiconductor devices, and is used in the AB effect device to be realized.

Another object of the present invention is to provide a heterojunction semiconductor device utilizing a quantum-mechanical effect.

These and other objects of the present invention are attained by providing a heterojunction semiconductor device comprising a first compound semiconductor layer and a second compound semiconductor layer having an electron affinity different from that of the first semiconductor layer, the first and second compound semiconductor layers forming a heterojunction interface therebetween. The first layer has an energy at the conduction band bottom thereof higher than that of the second layer and is doped with donor impurities, wherein at least one concave or convex portion of the first semiconductor layer is formed at the heterojunction interface and both sides of the concave or convex portion serve as a potential well or potential barriers against electrons accumulated in the second semiconductor layer close to the vicinity of heterojunction interface.

Where one convex portion of the second compound semiconductor layer (corresponding to one concave portion of the first compound semiconductor layer) forms a single quantum well, a quasi-one dimensional electron gas appears in a single quantum well having a width of 500 nm or less, preferably 100 nm or less. Preferably, the depth of the concave portion is 500 nm or less, more preferably 50 nm or less. Also, preferably the cross section of the concave (or convex) portion has a rectangular shape, since a trapezoidal sectional concave portion weakens the confinement of electrons therein.

It is possible to form a single potential barrier by using the convex portion of the first compound semiconductor layer, and therefore, preferably the single potential barrier (convex portion) has a width of 500 nm or less (more preferably 50 nm or less) and a height (corresponding to a depth) of 800 nm or less (more preferably 80 nm or less).

Further, preferably the first compound semi-conductor layer of AlGaAs (AlInAs or the like) is doped with the donor impurities and the second compound semiconductor layer is formed of an undoped GaAs (GaInAs or the like).

It is possible to obtain a resonant tunnel diode by forming the two convex portions of the first compound semiconductor layer at the heterojunction interface, to thereby generate two tunnel barriers and form a quantum well of a portion of the second compound semiconductor layer sandwiched between the two convex portions, and by forming a first electrode and a second electrode at both end portions of the second semiconductor layer.

It is possible to obtain a HEMT using the resonant tunneling structure of the above-mentioned resonant tunnel diode by adding a gate electrode formed on the first compound semiconductor layer above the quantum well.

Preferably, a plurality of the narrow stripe concave or convex portions of the first semiconductor layer are formed at regular intervals in one direction at the heterojunction interface, to thereby form minibands of energy for electrons accumulated in the convex or concave portions of the second compound semiconductor layer. In this case, a two-dimensional superlattice corresponding to a quantum wire structure consisting of quantum wells and potential (tunneling) barriers can be formed.

Also, preferably each of the quantum wells has a width of 500 nm or less (more preferably, 50 nm or less), and each of the potential barriers has a width of 500 nm or less (more preferably, 50 nm or less) and a height of 500 nm or less (more preferably 50 nm or less).

Further, preferably the concave or convex portions of the first semiconductor layer are formed in quantum dots (boxes), which are arranged at regular intervals in two directions at the heterojunction interface, to thereby form minibands of energy for electrons accumulated in the portion of the second compound semiconductor layer. In this case, a three-dimensional superlattice corresponding to a quantum dot (box) structure can be formed.

It is possible to utilize the two-dimensional or three-dimensional superlattice as a channel region of an FET, and in this case, a source electrode and a drain electrode is formed at both end portions of the channel region, and a gate electrode is formed on the first semiconductor layer above the channel region.

It is possible to obtain an AB effect device by forming a concave portion of the first semiconductor layer into the shape of a ring with two leads diametrically positioned thereon at the heterojunction interface, and by additionally formed a source electrode and a drain electrode at both end portions of the concave portion leads and providing a means for controlling the phases of two electron waves divided by the ring of the concave portion.

BRIEF DESCRIPTION OF THE DRAWINGS

The present invention will be more apparent from the description of the preferred embodiments set forth below, with reference to the accompanying drawings in which:

FIG. 1b is a potential diagram of the conventional resonant tunnel diode shown in FIG. 1a;

DESCRIPTION OF THE PREFERRED EMBODIMENTS

A heterojunction semiconductor device according to a first embodiment of the present invention is now explained with reference to FIGS. 6 to 10.

Figure 1A:
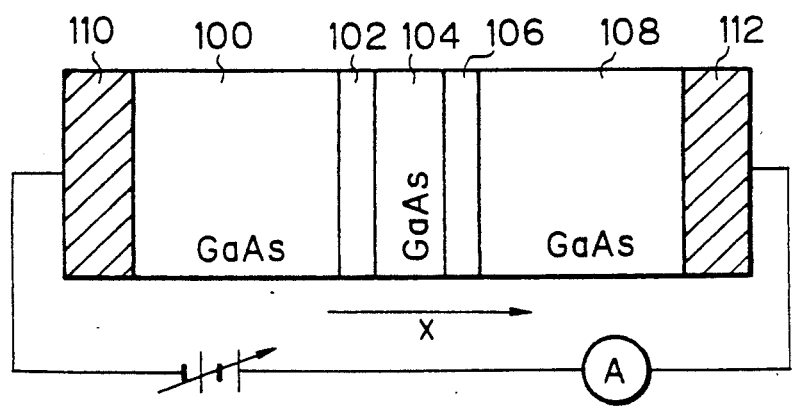
FIG. 1a is a schematic sectional view of a conventional resonant tunnel diode.
Figure 1B:
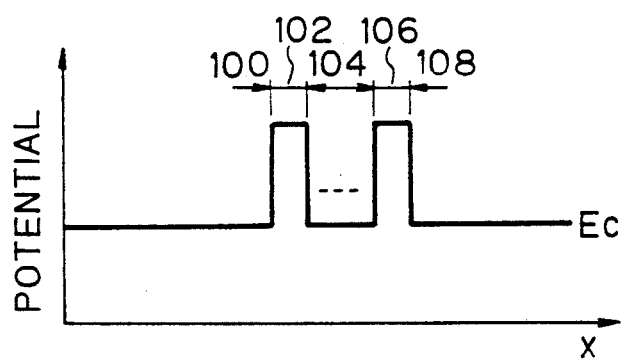
Figure 2:
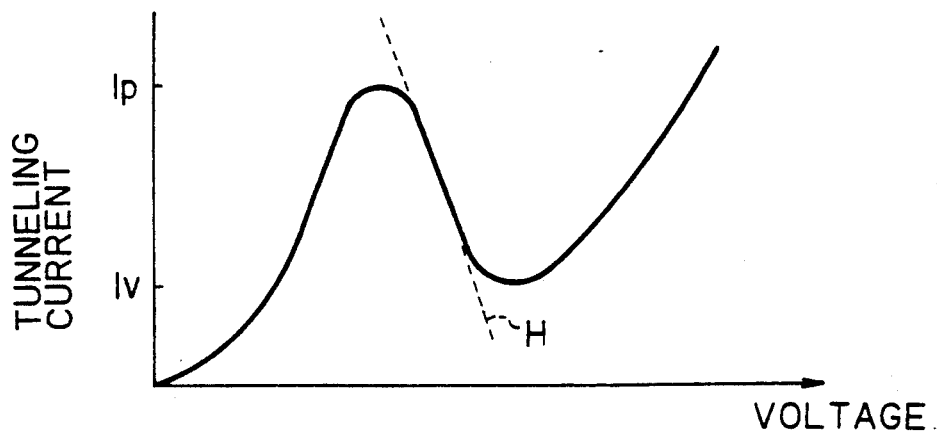
FIG. 2 is an I-V characteristic diagram of the conventional resonant tunnel diode.
Figure 3:
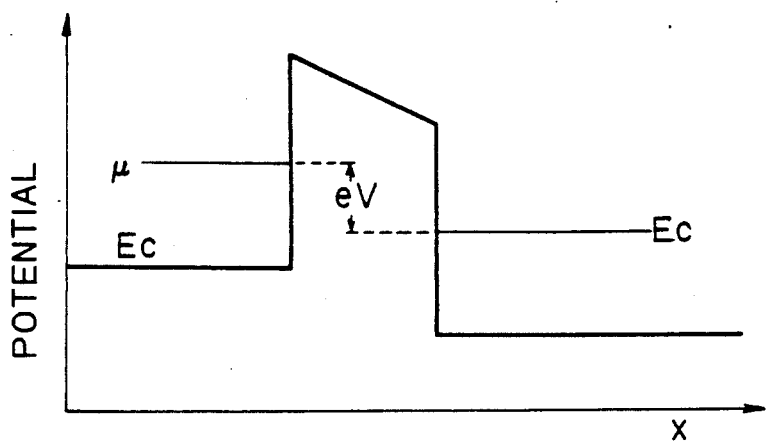
FIG. 3 is a potential diagram of a conduction band edge at a potential barrier.
Figure 4A:
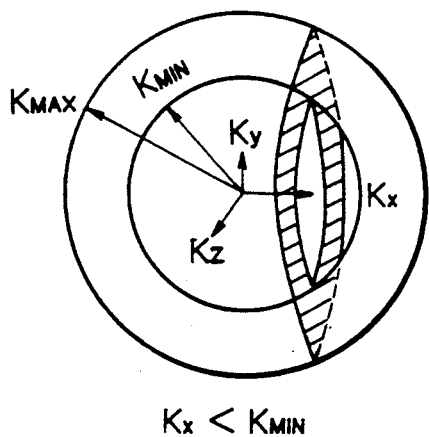
FIG. 4a is a wave vector space diagram of the conventional resonant tunnel diode at $K_X < K_{MIN}$.
Figure 4B:
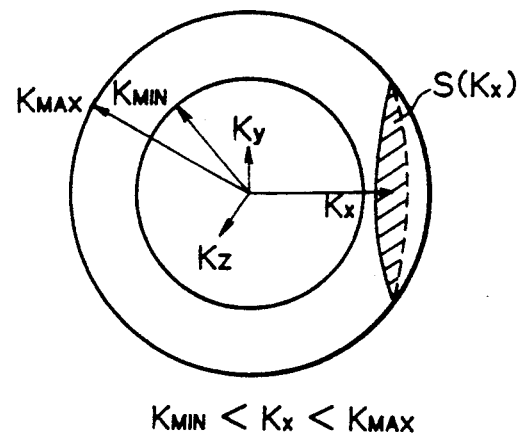
FIG. 4b is a wave vector space diagram of the conventional resonant tunnel diode at $K_{MIN} < K_X < K_{MAX}$.
Figure 5:
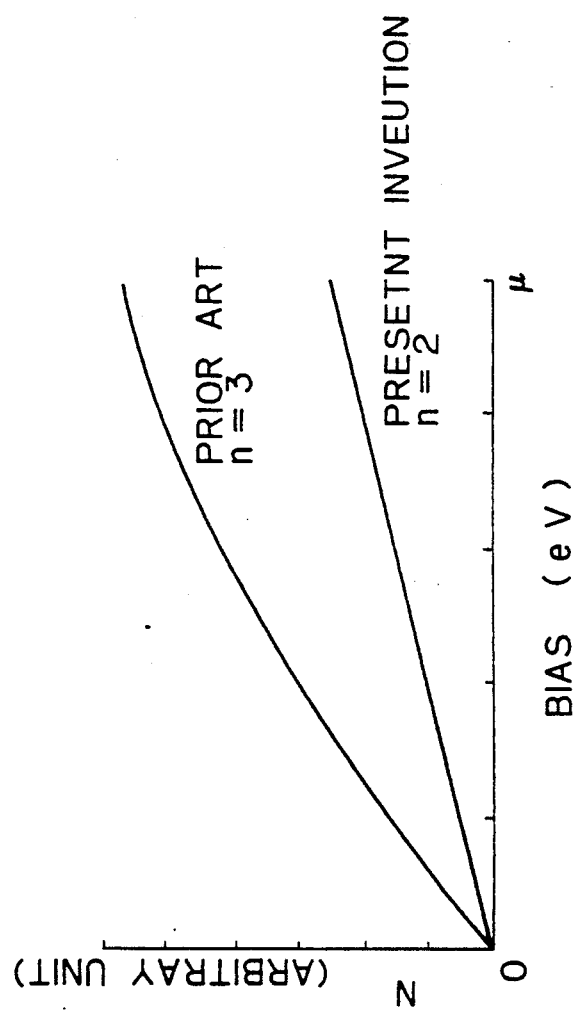
FIG. 5 is a graph showing a relationship between number of states of electron and vias.
Figure 6:
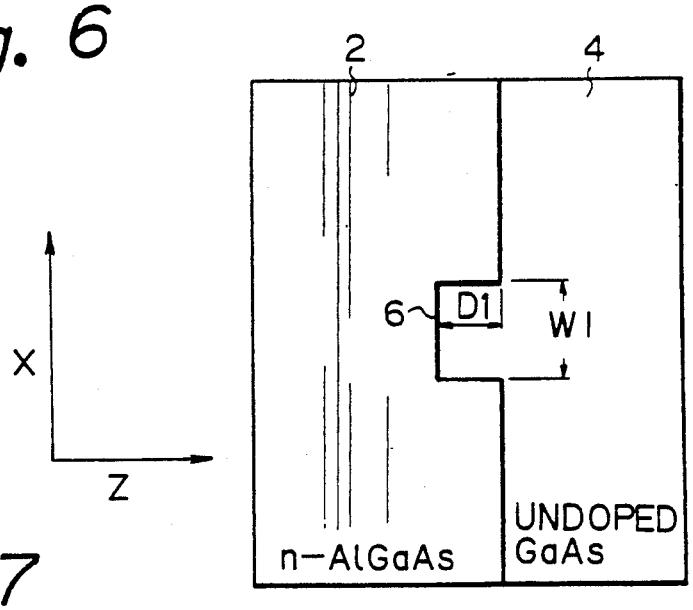
FIG. 6 is a schematic sectional view of a heterojunction semiconductor device according to a first embodiment of the present invention.

As shown in FIG. 6, an n-type AlGaAs layer 2 doped with donor impurities (e.g., Si donors) is epitaxially deposited on an undoped GaAs layer 4 in a reverse direction to the arrow direction "Z", to form a heterojunction. The GaAs has a smaller energy gap than that of the AlGaAs and a lower conduction band edge energy Ec than that of AlGaAs. In accordance with the present invention, a concave (recess) portion 6 having a width W1 and a depth D1 and extending in a direction "Y" (vertical to a drawing paper) is formed in the n-type AlGaAs layer 2 at the heterojunction interface. Accordingly, a convex (projecting) portion of the undoped GaAs layer 4 corresponds to the concave portion 6 of the AlGaAs layer 2.

Figure 7:
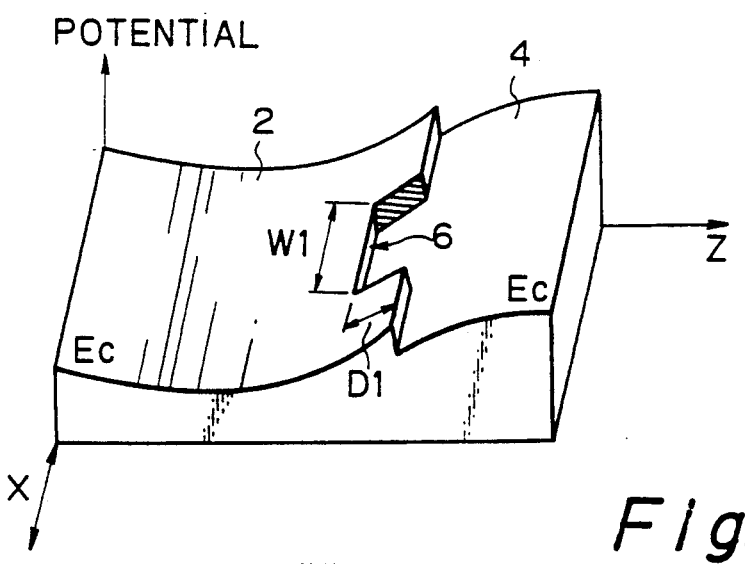
FIG. 7 is a model view of an energy of the conduction band edge of the device of FIG. 6.

In this case, as shown in FIG. 7, which is a model view of an energy band, a potential of the hetero-junction interface between the n-type AlGaAs layer 2 and undoped GaAs layer 4 varies due to the concave portion 6. The discontinuity gap ΔEc in the energies Ec of the conduction-band edges in the two compound semiconductor layers 2 and 4 appears not only on the heterojunction interface portions at the bottom of the concave portion 6 and at the normal portion other than the concave portion in the "Z" direction, but also on the heterojunction interface portions at the sides of the concave portion 6 in the "X" direction.

Figure 8:
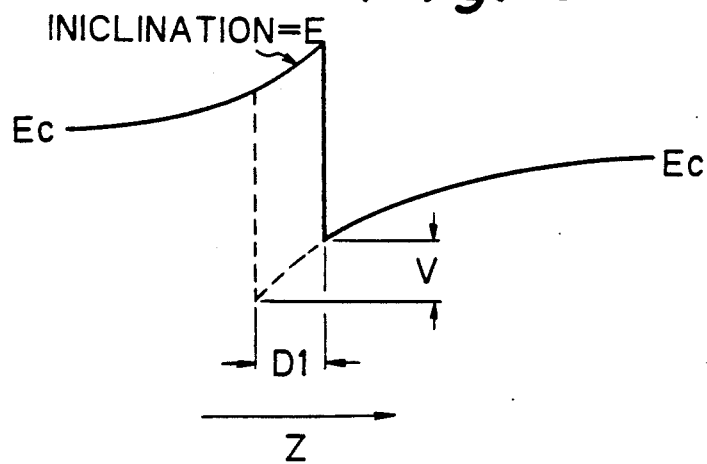
FIG. 8 is a potential diagram of the concave portion of the device of FIG. 6.

Furthermore, as shown in FIG. 8, in the "Z" direction within the concave portion 6, the heterojunction interface potential at the bottom of the concave portion 6 is lower than that at the normal portion other than the concave portion. This difference (potential barrier) V is represented by:

$$V = E \cdot D1$$

wherein E is an electric field intensity at the interface.

Figure 9A:
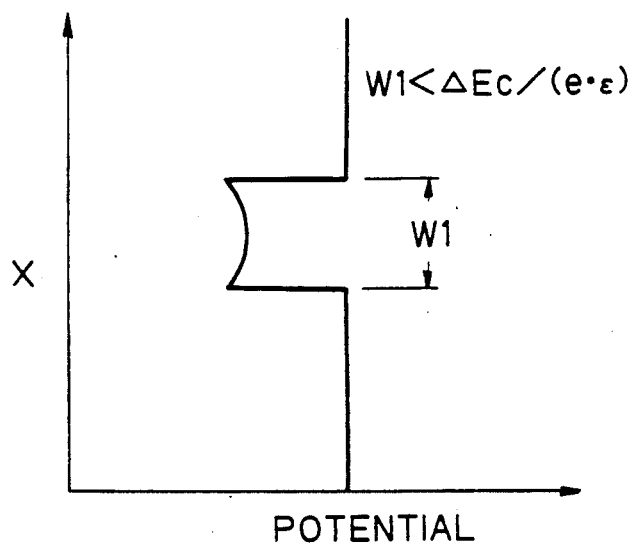
FIG. 9a is a potential diagram of the device of FIG. 6, taken in the "X" direction at $W1 < \Delta Ec/(e \cdot \epsilon)$.
Figure 9B:
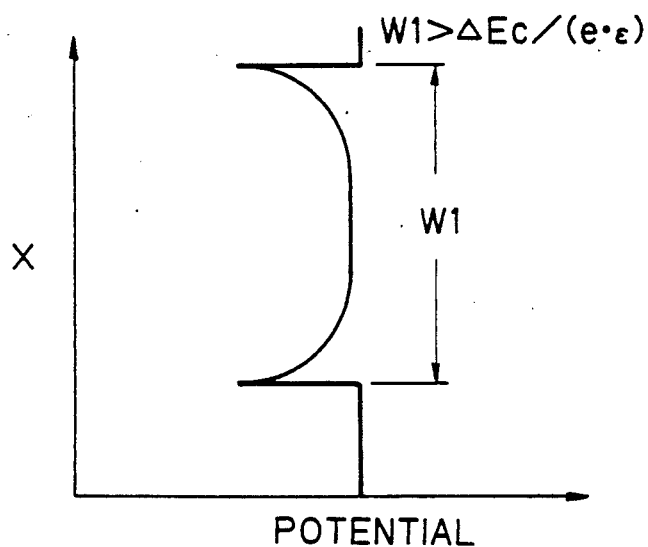
FIG. 9b is a potential diagram of the device of FIG. 6, taken in the "X" direction at $W1 > \Delta Ec(e \cdot \epsilon)$.

Since the discontinuity gap ΔEc in the energies Ec of the conduction-band edges in the two compound semiconductor layers 2 and 4 is generated at the heterojunction interface portions at the sides of the concave portion 6 in the "X" direction, a potential well is formed at the concave portion 6 in the "X" direction. Where an electric field intensity from the heterojunction interface toward the undoped GaAs layer 4 is represented by ε, when the width W1 of the concave portion 6 is represented by:

$$W1 < \Delta Ec/(e \cdot \epsilon)$$

wherein "e" is the elementary electric charge (quantum electricity), a potential well profile as shown in FIG. 9a is obtained. This profile is almost a square. On the other hand, when the width W1 is represented by:

$$W1 > \Delta Ec/(e \cdot \epsilon)$$

a potential well profile as shown in FIG. 9b is obtained. In this case, a potential value at the center of the potential well approaches the potential value at the heterojunction interface other than the concave portion 6.

Figure 10:
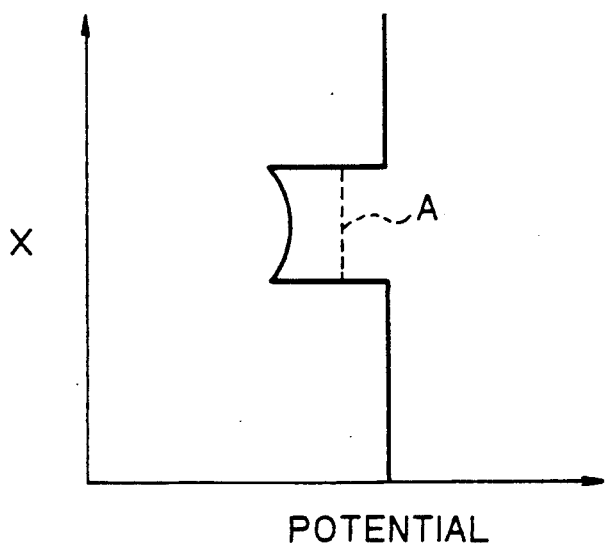
FIG. 10 is a potential diagram of the device of FIG. 6, taken in the "X" direction and showing a quasi-one dimensional electron gas in a quantum well.

Therefore, according to the first embodiment of the present invention, the formation of the concave portion 6 at the heterojunction interface between the n-type AlGaAs layer 2 and undoped GaAs layer 4 forms a modulation potential against a two-dimensional electron gas generated at the heterojunction interface. If the concave portion 6 is not formed, the heterojunction interface between the layers 2 and 4 is completely flat, and thus the two-dimensional electron gas generated at the interface moves as Bloch electrons in a parallel direction to the interface. The formation of the concave portion 6, however, forms the potential well and generates the potential modulation against electrons, with the result that the electrons can be confined in the potential well. Therefore, where the width W1 and depth D1 of the concave portion 6 are suitably controlled and a Fermi level is positioned at a bound energy in the well, a quasi-one-dimensional electron gas "A" is formed in the fine potential well extending in the "Y" direction, as shown in FIG. 10.

Another type of heterojunction semiconductor device according to a second embodiment of the present invention is explained with reference to FIGS. 11 to 13a and 13b.

Figure 11:
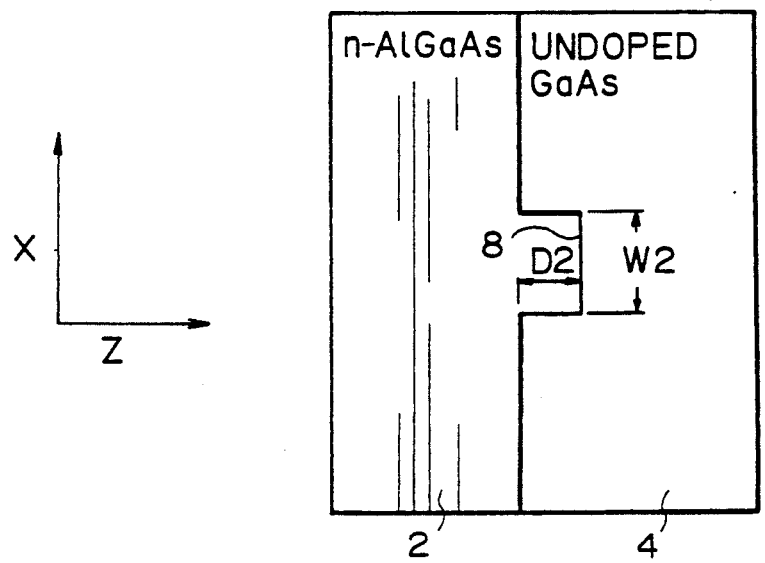
FIG. 11 is a schematic sectional view of a heterojunction semiconductor device according to a second embodiment of the present invention.

As shown in FIG. 11, the n-type AlGaAs layer 2 is epitaxially deposited on the undoped GaAs layer 4 in a reverse direction to the arrow direction "Z", to form the heterojunction interface in the same manner as for the above-mentioned first embodiment. In this case, a convex (projecting) portion 8 of the AlGaAs layer 2 having a width W2 and a height D2, and extending in the "Y" direction, is formed at the heterojunction interface, and thus the potential is varied due to the convex portion 8. The discontinuity gap ΔEc in the energies Ec of the conduction-band edges in the two compound semiconductor layers 2 and 4 appears not only on the heterojunction interface portions at the top of the convex portion 8 and at the normal portion other than the convex portion in the "Z" direction, but also on the heterojunction interface portions at the sides of the convex portion 8 in the "X" direction.

Figure 12:
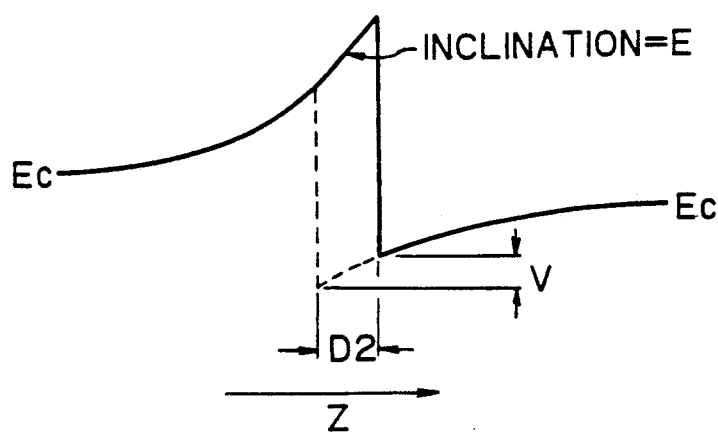
FIG. 12 is a potential diagram of the convex portion of the device of FIG. 11.

Furthermore, as shown in FIG. 12, in the "Z" direction in the convex portion 8, the heterojunction interface potential at the top of the convex portion 8 is higher than that at the normal portion other than the concave portion. This difference (potential barrier) V is represented by:

$$V = E \cdot D2$$

wherein E is an electric field intensity at the interface.

Figure 13A:
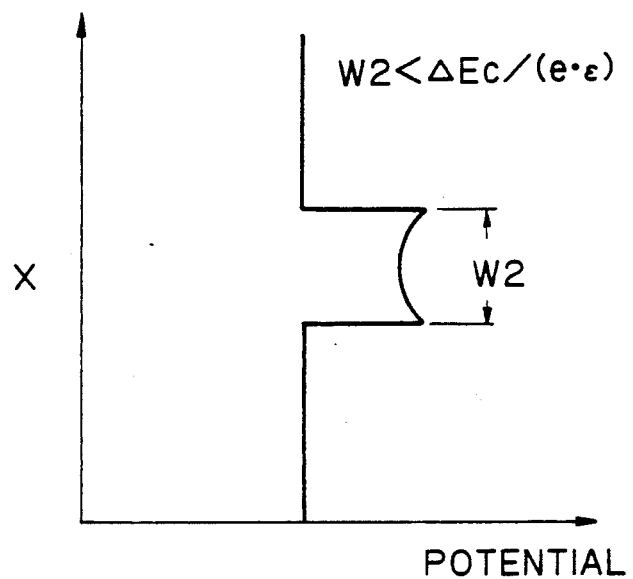
FIG. 13a is a potential diagram of the device of FIG. 11, taken in the "X" direction at $W2 < \Delta Ec/(e \cdot \epsilon)$.
Figure 13B:
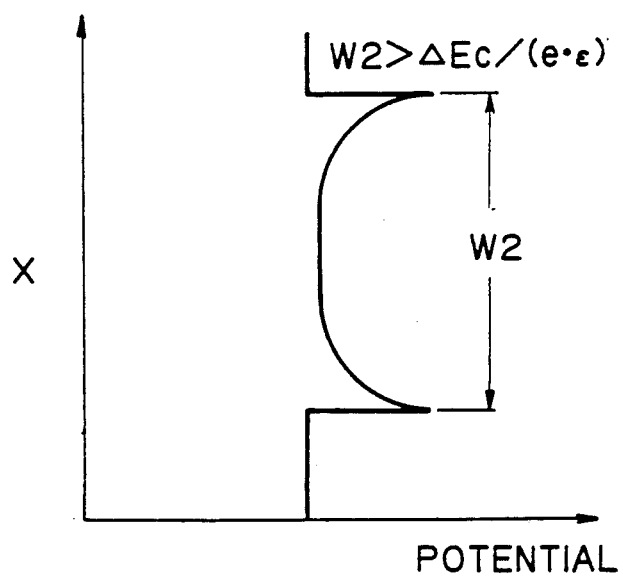
FIG. 13b is a potential diagram of the device of FIG. 11, taken in the "X" direction at $W2 > \Delta Ec/(e \cdot \epsilon)$.

Since the discontinuity gap ΔEc in the energies Ec of the conduction-band edges in the two compound semiconductor layers 2 and 4 is generated at the heterojunction interface portions at the sides of the convex portion 8 in the "X" direction, a potential barrier is formed at the convex portion 8 in the "X" direction. Where an electric field intensity from the heterojunction interface toward the undoped GaAs layer 4 is represented by ε, when the width W2 of the convex portion 8 is represented by:

$$W2 < \Delta Ec/(e \cdot \epsilon)$$

a potential barrier profile shown in FIG. 13a is obtained. This profile is almost a square. On the other hand, when the width W1 is represented by:

$$W2 > \Delta EC/(e \cdot \epsilon)$$

a potential barrier profile shown in FIG. 13b is obtained. In this case, a potential value at the center of the potential barrier approaches the potential value at the heterojunction interface other than the convex portion 8.

Therefore, according to the second embodiment of the present invention, the convex portion 8 is formed at the heterojunction interface between the n-type AlGaAs layer 2 and undoped GaAs layer 4, and the width W2 and height D2 of the convex portion 8 are suitably controlled, which forms a desired potential barrier causing a modulation potential against a two-dimensional electron gas generated at the heterojunction interface.

A heterojunction semiconductor device 8a resonant tunnel diode) according to a third embodiment of the present invention is explained with reference to FIGS. 14 and 15a to 15d.

Figure 14:
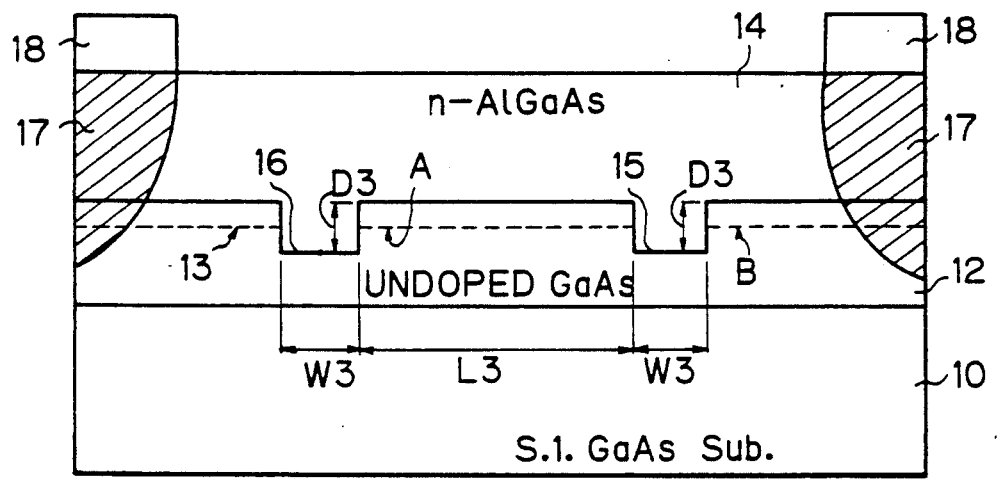
FIG. 14 is a schematic sectional view of a heterojunction semiconductor device according to a third embodiment of the present invention.

As shown in FIG. 14, the resonant tunnel diode uses two convex portions 15 and 16 of an n-type AlGaAs layer 14, parallel to each other, formed at the heterojunction interface. These portions 15 and 16 correspond to the convex portion 8 of the second embodiment.

An undoped GaAs layer 12 and an n-type AlGaAs layer 14 doped with donor impurities are formed in sequence on a semi-insulating GaAs substrate 10, to form an heterojunction between the layers 12 and 14, and thus in general electrons are fed from the donor impurities doped in the n-type AlGaAs layer 14 into the undoped GaAs layer 12, to thereby generate a two-dimensional electron gas "B" in the vicinity of the heterojunction interface.

The formed convex (projecting) portions 15 and 16 having a width W3 and a height D3 extend in the "Y" direction (vertical to the drawing plane) and are arranged in parallel at a distance L3 therebetween. The width W3 and height D3 of each of the convex portions 15 and 16 are suitably controlled to form two desired potential barriers, as in the second embodiment. The distance L3 between the convex portions is suitably controlled shorter than a mean free path of electron to form a quantum well of the undoped GaAs sandwiched by the convex portions (barriers) 15 and 16. The mean free path l of electron is indicated is given by:

$$l = v_F \tau$$

wherein $v_F$ is a Fermi velocity and $\tau$ is a relaxation time. The relaxation time is related to a mobility $\mu$ as indicated by:

$$\mu = \frac{e}{m} \tau$$

wherein e is an elementary electric charge, and m is an effective mass, on basis of a simplified transport theory. The Fermi velocity $v_F$ is given by:

$$v_F = \sqrt{\frac{2E_F}{m}}.$$

wherein $E_F$ is a Fermi energy. Accordingly, the electron mean free path l is given by:

$$l = \frac{\mu}{e} \sqrt{2mE_F}.$$

The mobility u takes a value of 0.1 to $10^2$ m$^2$·V$^{-1}$sec$^{-1}$ and the Fermi energy $E_F$ takes a value of 0.1 to 20 meV. Accordingly, the mean free path l takes a value of 1 to 10 μm. As the result, it is necessary to make the distance L3 shorter than the electron mean free path l with depending on the electrons in the semiconductor device. Therefore, it is possible to restrict the two-dimensional electron gas generated in the undoped GaAs layer between the portions 15 and 16 to the quasi-one-dimensional electron gas "A". Namely, a quasi-one-dimensional resonant level exists in the quantum well. Furthermore, ohmic electrode regions 17 extend from the top surface of the AlGaAs layer 14 into the GaAs layer 12 outside the two convex portions 15 and 16, and electrodes 18 of, e.g., AuGe/Au, are set on the regions 17 of the AlGaAs layer 14. Accordingly, a resonant tunnel structure to the two-dimensional electron gas is formed with the two potential barriers of the convex portions 15 and 16 formed at the heterojunction interface, and at the quantum well between these potential barriers.

The resonant tunnel diode (FIG. 14) is produced in the following manner.

Figure 15A:
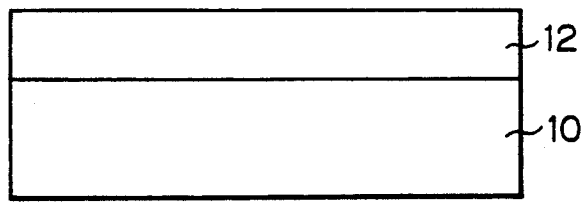
FIGS. 15a to 15d are schematic sectional views of the device of FIG. 14 at various stages in the production thereof.
Figure 15B:
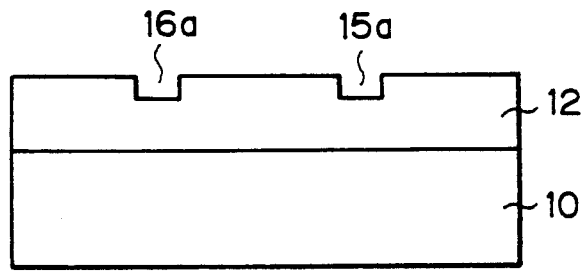

As shown in FIG. 15a, the semi-insulating GaAs substrate 10 is prepared and is set in an ultra-high vacuum chamber of an MBE (molecular beam epitaxy) apparatus. The undoped GaAs layer 12 is epitaxially grown on the substrate 10, using the MBE apparatus, and then the layer 12 in this ultra-high vacuum chamber is selectively etched by a maskless etching method using a focused ion beam, to form recesses (concave portions) 15a and 16a having the width W3 and depth D3 and parallel to each other at a distance L3, as shown in FIG. 14b. In this case, the GaAs substrate 10 with the GaAs layer 12 is held on a movable stage at room temperature, gas of Cl$_2$ (or methane) is sprayed onto the GaAs layer 12, a vacuum pressure near the surface of the layer 12 is kept at $1 \times 10^4$ Torr, and an average vacuum pressure in the chamber is kept at $1 \times 10^7$ Torr. A Ga ion beam is focused at a beam diameter of 0.1 μm and bombards the layer 12 at a predetermined position and at an energy of 10 kV, with an electric current of 10 pA, and as a result, the layer 12 is selectively etched to form a recess having a predetermined pattern. The etched surface has a good morphology, and when the spraying of the Cl$_2$ gas and the Ga ion bombardment are digitally changed (alternately performed), the morphology is further improved.

Figure 15C:
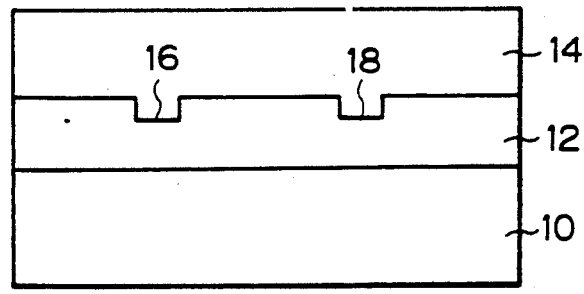

Next, the surface of the undoped GaAs layer 12 with the recesses is cleaned, to prevent contamination. For example, the absorbed chlorine on the GaAs layer surface is removed by heating the stage to a temperature at which an epitaxial growth is sublimed (vaporized). If necessary, the stage can be heated at a higher temperature or a surface treatment using hydrogen radicals at the stage temperature of 300° to 400° C. carried out. As shown in FIG. 15c, the n-type AlGaAs layer 14 doped with donor impurities is epitaxially grown on the GaAs layer 12 with the same MBE apparatus, with the result that the layers 12 and 14 form the heterojunction and the convex (projecting) portions 15 and 16 of the AlGaAs layer 14 are formed in parallel at the distance L3.

Figure 15D:
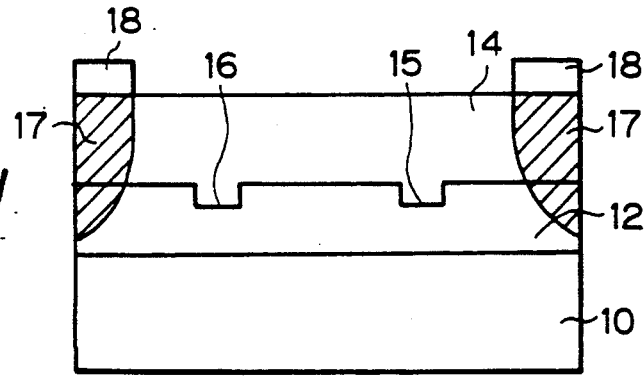

As shown in FIG. 15d, two ohmic electrodes 18 of, e.g., AuGe/Au, are selectively formed by a suitable deposition process and a lift-off process, and are annealed to form alloying regions, i.e., ohmic electrode regions 17 reaching the undoped GaAs layer 12 and arranged outside the two convex portions 15 and 16, whereby the resonant tunnel diode shown in FIG. 14 is obtained.

It is possible to use an semi-insulating InP substrate, an undoped GaInAs layer and an AlInAs layer doped with Si, instead of the GaAs substrate 10, the GaAs layer 12 and the AlGaAs layer 14, respectively.

According to the third embodiment of the present invention, the formation of the two convex portions 15 and 16 at the heterojunction interface between the AlGaAs layer 14 and the GaAs layer 12 at a predetermined distance L3 enables the diode to operate a resonant tunneling process for the two-dimensional electron gas generated at the heterojunction interface. The conventional tunnel diode shown in FIGS. 20a and 20b has conduction electrons moving in three-dimensional directions, so that a differential negative property in a current-voltage (I-V) characteristics is lowered to reduce the tunneling effect. On the other hand, the tunnel diode produced in accordance with the present invention enables the conduction electrons to move in two-dimensional directions, whereby the differential negative property is remarkably improved.

A heterojunction semiconductor device (a HEMT utilizing the resonant tunnel structure of the third embodiment as a channel thereof) according to a fourth embodiment of the present invention is now explained with reference to FIG. 16.

Figure 16:
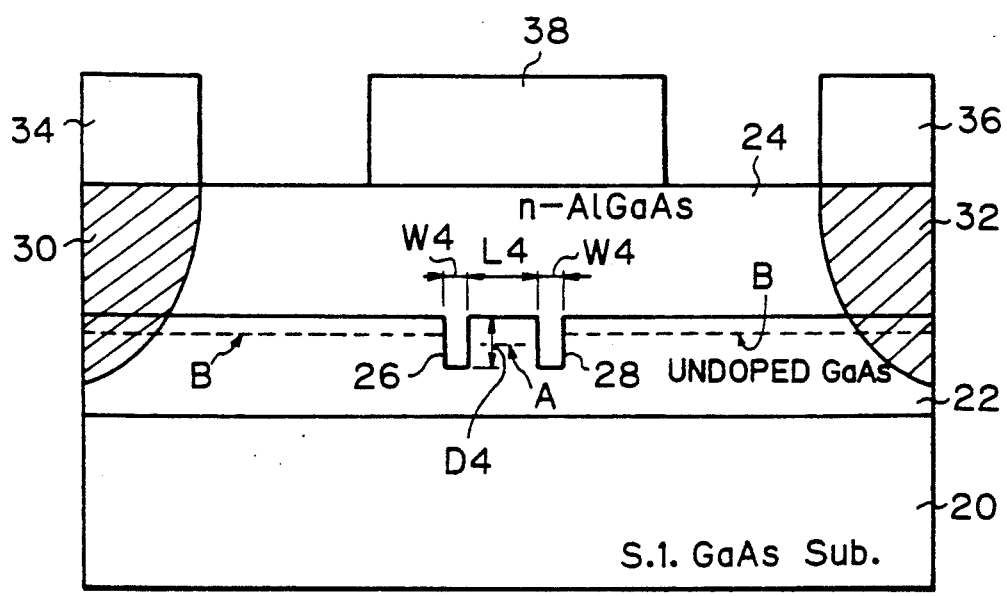
FIG. 16 is a schematic sectional view of a heterojunction semiconductor device according to a fourth embodiment of the present invention.

As can be seen from FIGS. 16 and 14, a device structure of the HEMT of FIG. 16 is similar to that of the tunnel diode of FIG. 14, except for a gate electrode 38 formed on an n-type AlGaAs layer 24 above two convex portions 26 and 28. An undoped GaAs layer 22 and an n-type AlGaAs layer 24 are epitaxially deposited in sequence on a semi-insulating GaAs substrate 20 to form a heterojunction between the layers 22 and 24. In accordance with the present invention, two convex (projecting) portions 26 and 28 of the n-type AlGaAs layer 24 having a width W4 and a height D4 extending on the interface and in the "Y" direction are arranged in parallel at a distance L4. Therefore, as in the third embodiment, it is possible to form two predetermined potential barriers and a quantum well sandwiched thereby, and to generate the two-dimensional electron gas B outside the convex portions 16 and 28 and the quasi-one dimensional electron gas A within the well (FIG. 16), whereby a resonant tunnel structure for the two-dimensional electron gas is formed.

Ohmic electrode regions 30 and 32 are formed to reach the GaAs layer 22 from the top surface of the AlGaAs layer 24, and the two convex portions 26 and 28 arranged therebetween. A source electrode 34 and a drain electrode 36 made of, e.g., AuGe/Au are formed on the regions 30 and 32, respectively. Furthermore, the gate electrode 38 of, e.g., Al, which forms a Schottky junction, is formed on the n-type AlGaAs layer 24 above the resonant tunnel structure. In this case, a gate voltage applied to the gate electrode 38 is controlled to regulate a transmission coefficient of electron tunneling through the resonant tunnel structure formed by the parallel convex portions 26 and 28 arranged at the predetermined distance L4.

Therefore, according to the fourth embodiment of the present invention, the formation of the two convex portions 26 and 28 of the n-type AlGaAs layer 24 at the heterojunction interface forms the resonant tunnel structure for the two-dimensional electron gas, and the control of the gate voltage of the gate electrode 38 regulates the resonant tunneling process (operation) in the two-dimensional electron channel. In such structure, an electron tunneling probability varies by increasing or decreasing a Fermi level of electron with the gate electrode. Therefore, a voltage applied across the source and drain may be sufficient small, if necessary. An operating region of the semiconductor device is quite different from that of a conventional resonant tunnel element, and thus the device has an advantage of a low voltage operation.

A heterojunction semiconductor device having a two-dimensional superlattice according to a fifth embodiment of the present invention is explained with reference to FIGS. 17 and 18.

Figure 17:
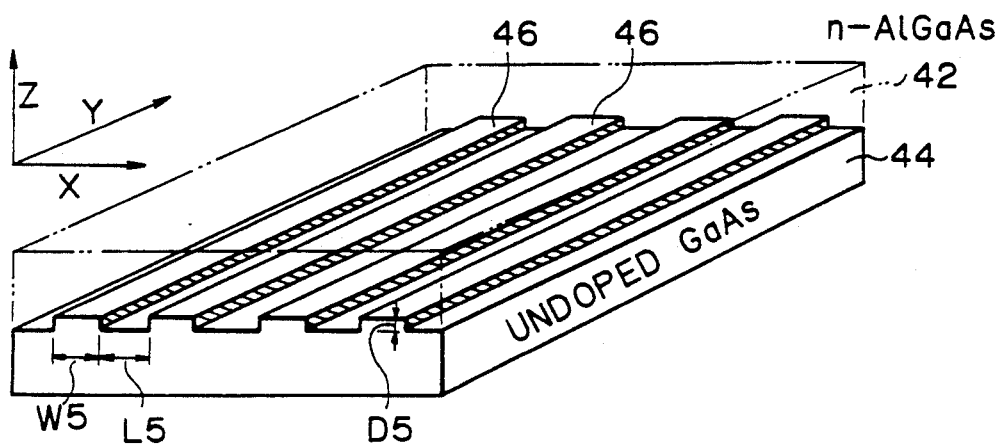
FIG. 17 is a schematic sectional view of heterojunction semiconductor device having a two-dimensional superlattice structure according to a fifth embodiment of the present invention.
Figure 18:
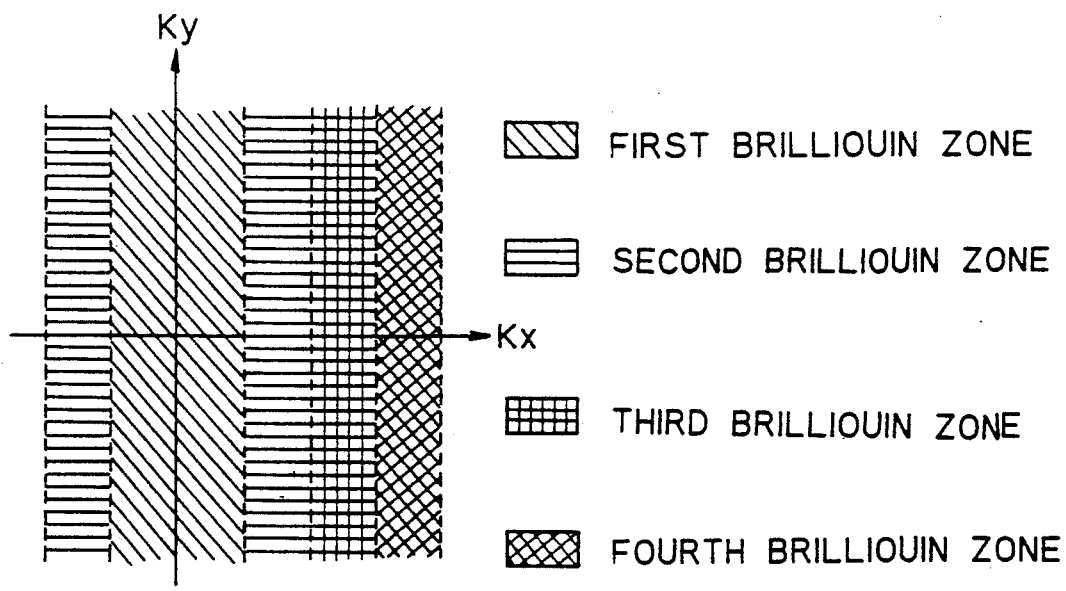
FIG. 18 is a mini-Brillouin zone diagram corresponding to a two-dimensional superlattice of FIG. 17.

As shown in FIG. 17, an n-type AlGaAs layer 42 is epitaxially deposited on an undoped GaAs layer 44 in the "Z" direction to form a heterojunction, and a plurality of concave portions 46 of the AlGaAs layer 42 (i.e., convex portions of the GaAs layer 44) extending in the "Y" direction are formed at regular intervals (or may be formed at quasi-periodic or irregular intervals) in the "X" direction. Note, according to the first embodiment of the present invention, only one concave portion 6 is formed. A width W5 and a depth D5 of each of the concave portions 46 and the interval (lattice spacing) L5 are suitably specified to arrange the concave portions in narrow stripes, with the result that the two-dimensional superlattice is formed at the heterojunction interface.

The two-dimensional superlattice formed in narrow stripes provides a modulation of the motion of the two-dimensional electron gas generated at the heterojunction interface in the "X" direction, and gives a periodic modulation of the potential. Namely, a Brillouin zone shown in FIG. 18 is formed, and in the reciprocal space thereof, electrons meet the Bragg reflection conditions at the broken lines and generate mini-forbidden bands. The condition of mini-bands caused by the mini-forbidden bands depends on the modulation potential. Where the narrow stripe two-dimensional superlattice is formed in accordance with the fifth embodiment, the two-dimensional electrons the movement, of which are limited in the "Z" direction, generate the modulation potential in the "X" direction to increase the modulation potential, with the result that the mini-forbidden bands of the mini-bands for the "X" direction movement are enlarged.

It is possible to form a plurality of convex portions of the n-type AlGaAs layer 42 at regular intervals at the heterojunction interface (similar to the convex portion 8 of the second embodiment), and where a width W and a height D of the convex portions and the intervals L are suitably specified, it is possible to form a two-dimensional superlattice in narrow stripes corresponding to the above-mentioned two-dimensional superlattice.

A heterojunction semiconductor device having a three-dimensional superlattice according to a sixth embodiment of the present invention is explained with reference to FIGS. 19 and 20.

Figure 19:
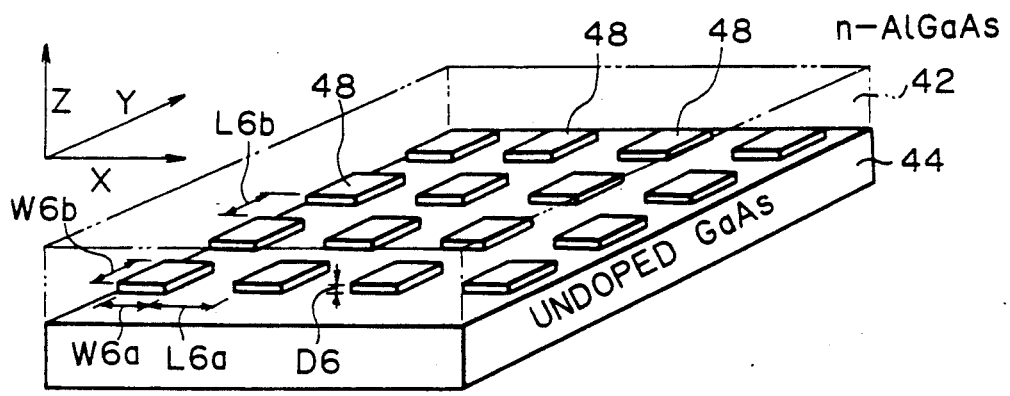
FIG. 19 is a schematic sectional view of a heterojunction semiconductor device having a three-dimensional superlattice structure according to a sixth embodiment of the present invention.
Figure 20:
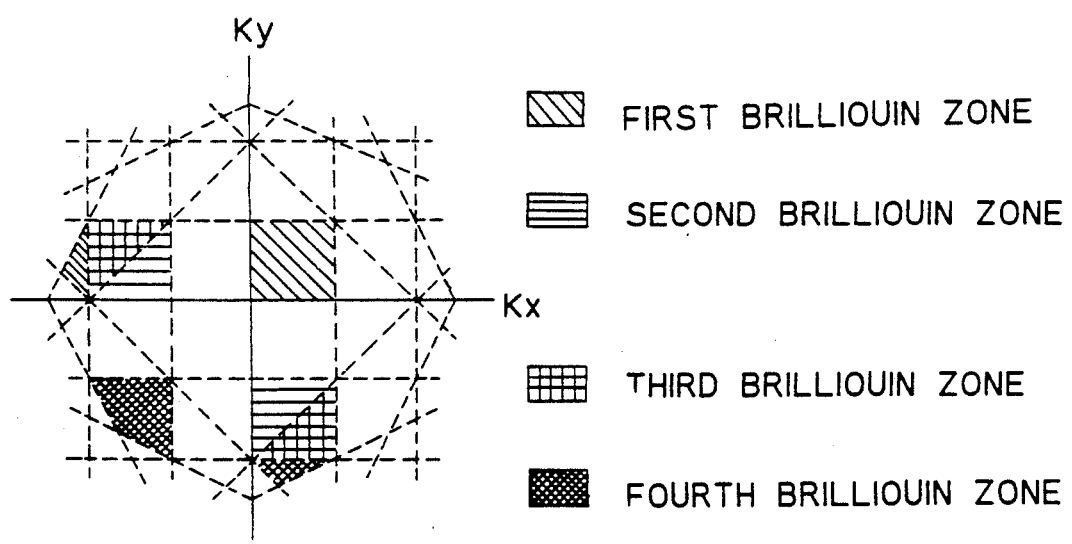
FIG. 20 is a mini-Brillouin zone diagram corresponding to a three-dimensional superlattice of FIG. 19.

As shown in FIG. 19, an n-type AlGaAs layer 42 is epitaxially deposited on an undoped GaAs layer 44 in the "Z" direction, to form a heterojunction, and a plurality of concave portions (box-like recesses) 48 of the AlGaAs layer 42 (i.e., convex portions (dots or boxes) of the GaAs layer 44) are formed at regular intervals in the "X" and "Y" directions. A first width W6a, a second with (i.e., length) W6b and a depth D6 of each of the concave portions 48, and the intervals (lattice spacings) L6a and L6b in the "X" and "Y" directions, are suitably specified to arrange the concave portions forming the three-dimensional superlattice at the heterojunction interface.

The three-dimensional superlattice in dots (boxes) provides a modulation of the motions of the two-dimensional electron gas generated at the heterojunction interface in the "X" and "Y" directions, and gives a periodic modulation of the potential. Namely, a Brillouin zone shown in FIG. 20 is formed, and in the reciprocal space thereof, electrons meet the Bragg reflection conditions at the broken lines and generate mini-forbidden bands. Note, the quadrants of FIG. 15 show a one-fourth region of each of the first to fourth Brillouin zones, respectively. Where the dot-like three-dimensional superlattice is formed in accordance with the sixth embodiment, the two-dimensional electrons, the movements of which are limited in the "Z" direction, generate the modulation potential in the "X" and "Y" directions to increase the modulation potential, with the result that the mini-forbidden bands of the mini-bands for the "X" and "Y" direction movement are enlarged.

It is possible to form a plurality of dot (box) convex portions of the n-type AlGaAs layer 42 at regular intervals at the heterojunction interface (similar to the convex portion 8 of the second embodiment), and where a first width, a second width (i.e., length) and a height of the box-like convex portions, and the intervals, are suitably specified, it is possible to form a dot-like three-dimensional superlattice corresponding to the above-mentioned three-dimensional superlattice. Although the three-dimensional superlattice has an energy band structure different from that of the above-mentioned superlattice of the sixth embodiment the former superlattice provides a modulation of the motions of the two-dimensional electron gas in the "X" and "Y" directions and gives a periodic modulation of the potential in the "X" and "Y" directions. These effects are similar to those of the sixth embodiment.

A heterojunction semiconductor device (a HEMT utilizing the two-dimensional superlattice (quantum wire) formed in the fifth embodiment as a channel of the HEMT) according to a seventh embodiment of the present invention is explained with reference to FIG. 21.

Figure 21:
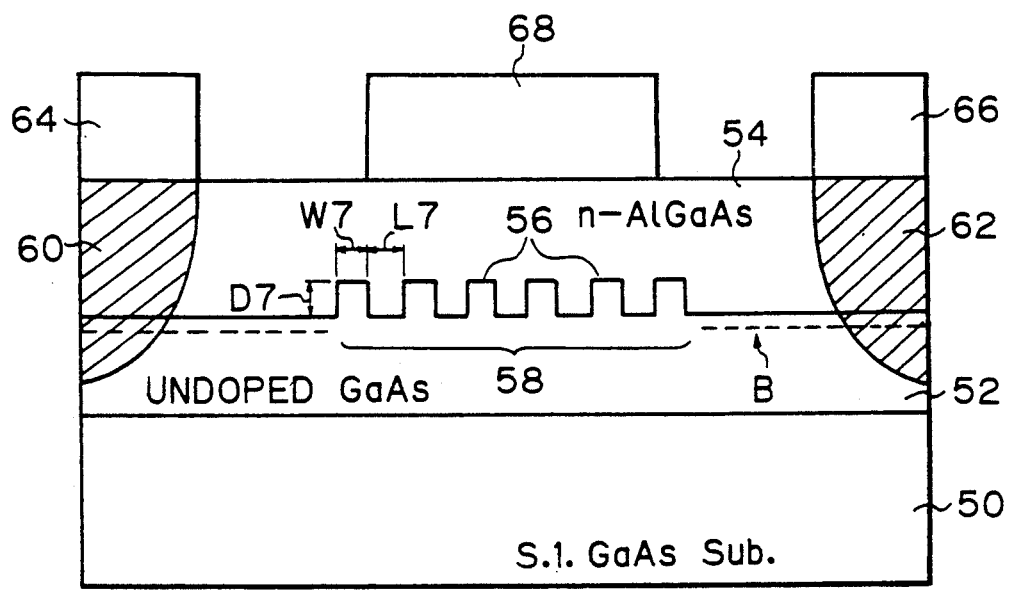
FIG. 21 is a schematic sectional view of a heterojunction semiconductor device having a two-dimensional superlattice structure according to a seventh embodiment of the present invention.

As shown in FIG. 21, an undoped GaAs layer 52 and an n-type AlGaAs layer 54 are epitaxially deposited in sequence on a semi-insulating GaAs substrate 50, to form a heterojunction, and a plurality of narrow stripe concave portions 56 of the AlGaAs layer 54 (i.e., convex portions of the GaAs layer 52) extending in the direction vertical to the drawing plane are formed at a regular intervals L7. The stripe portions 57 having a width W7 and a depth D7 constitute a channel region 58. Ohmic electrode regions 60 and 62 are formed to reach the GaAs layer 52 from the top surface of the AlGaAs layer 54 and are located at both sides of the channel region 58. A source electrode 64 and a drain electrode 66 made of, e.g., AuGe/Au are formed, respectively on the regions 60 and 62. Furthermore, the gate electrode 68 of, e.g., Al, which forms a Schottky junction, is formed on the n-type AlGaAs layer 24 above the channel region 58.

Accordingly, the channel region 58 includes the stripe type two-dimensional superlattice corresponding to that of the fifth embodiment and generates a large modulation potential therein, whereby a large miniband of the mini-forbidden bands for the channel direction movement of the two-dimensional electron gas B generated in the GaAs layer 52 exists in the vicinity of the heterojunction interface. In this case, a gate voltage applied to the gate electrode 68 is controlled to increase a variation of a transconductance $g_m$ when the Fermi level is within the mini-bands, since the mini-forbidden bands of the minibands in the channel region 58 are sufficiently large and have a high electrons density state, and therefore, the performance characteristics, such as a gain and an operating speed, of the FET are remarkably improved. Namely, the control of the gate voltage regulates a conductance between the source electrode 64 and the drain electrode 66.

A heterojunction semiconductor device (a semi-conductor laser using the two-dimensional superlattice (quantum wire) formed in the fifth embodiment as an active layer of the laser) according to an eighth embodiment of the present invention is explained with reference to FIG. 22.

Figure 22:
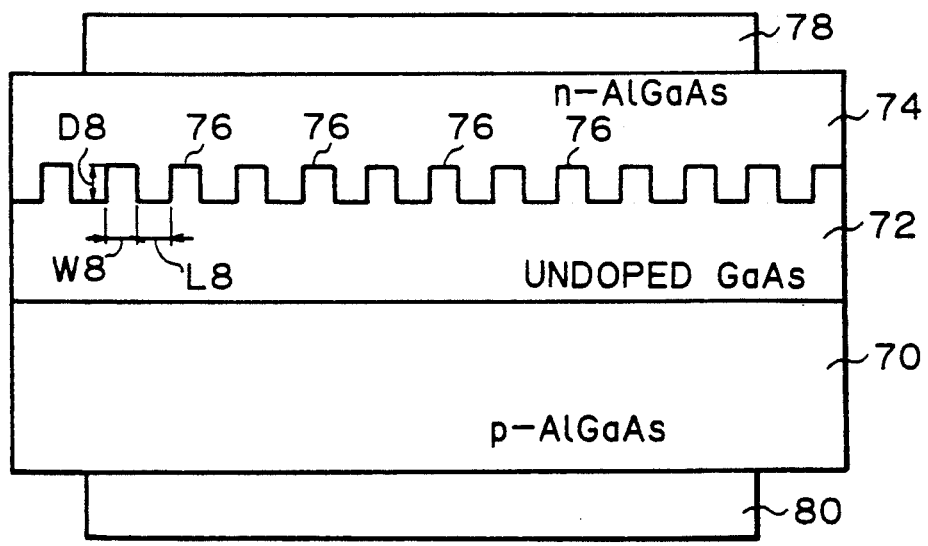
FIG. 22 is a schematic sectional view of a heterojunction semiconductor device having a two-dimensional superlattice structure according to an eighth embodiment of the present invention.

As shown in FIG. 22, an active layer of an undoped GaAs layer 72 and an upper clad layer of an n-type AlGaAs layer 74 are epitaxially deposited in sequence on a lower clad layer of a p-type AlGaAs layer 70, to form two heterojunctions between the layers 70 and 72 and between the layers 72 and 74. Moreover, a plurality of narrow stripe concave portions 76 of the n-type AlGaAs layer 74 (i.e., convex portions of the undoped GaAs layer 72) extending in one direction (vertical to the drawing plane) are formed at regular intervals L8 at the heterojunction interface between the layers 72 and 74. Each of the concave portions 76 of the layer 74 has a width W8 and a depth D8. An ohmic n-side electrode 78 of, e.g., AuGe/Au is formed on the n-AlGaAs layer 74 and an ohmic p-side electrode 80 of, e.g., AuCr, is formed on the p-AlGaAs layer 70.

The laser has the stripe type two-dimensional superlattice corresponding to that of the fifth embodiment, which generates a large modulation potential, and accordingly, electrons are injected in the active layer (undoped GaAs layer 72) from the doped AlGaAs layer 74 and are confined near the interface. When a forward bias is applied to the laser, a current flows from the p-side electrode 80 toward the n-side electrode 78, and since the mini-forbidden bands of the minibands in the active layer with the two-dimensional superlattice are sufficiently large and have a high electron density state, the performance characteristics of the semiconductor laser are remarkably improved, e.g., a gain thereof is increased and the threshold current density is reduced.

It is possible to replace the two-dimensional superlattice in the semiconductor devices of the seventh and eighth embodiments with the three-dimensional superlattice formed in the sixth embodiment, and in this case, the increase of the number of dimensions for limiting the degree of freedom makes the modulation potential large, which enlarges the width of the mini-forbidden bands of the minibands and increases the density of the electrons, and as a result, it is possible to further improve the performance characteristics of the devices.

A heterojunction semiconductor device (an Aharonov-Bohm effect (AB effect) device) according to a ninth embodiment of the present invention is explained with reference to FIGS. 23 and 24a and 24b.

Figure 23:
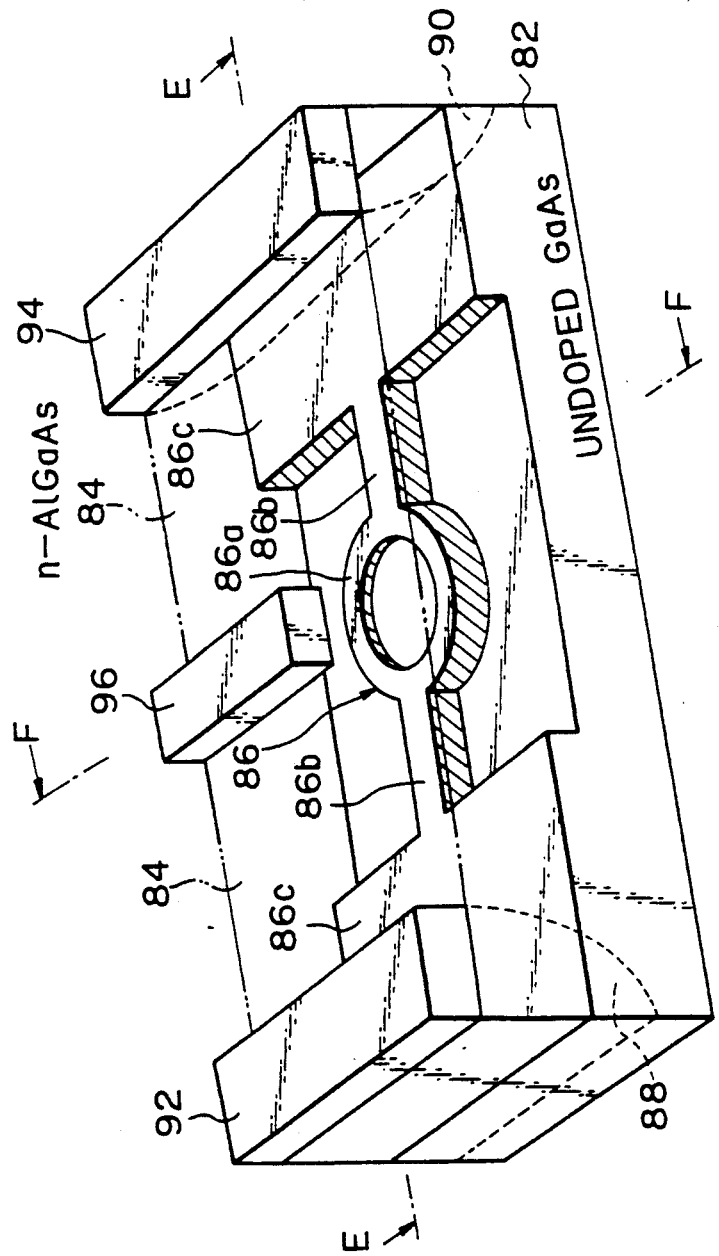
FIG. 23 is a schematic perspective view an AB effect device according to a ninth embodiment of the present invention.
Figure 24A:
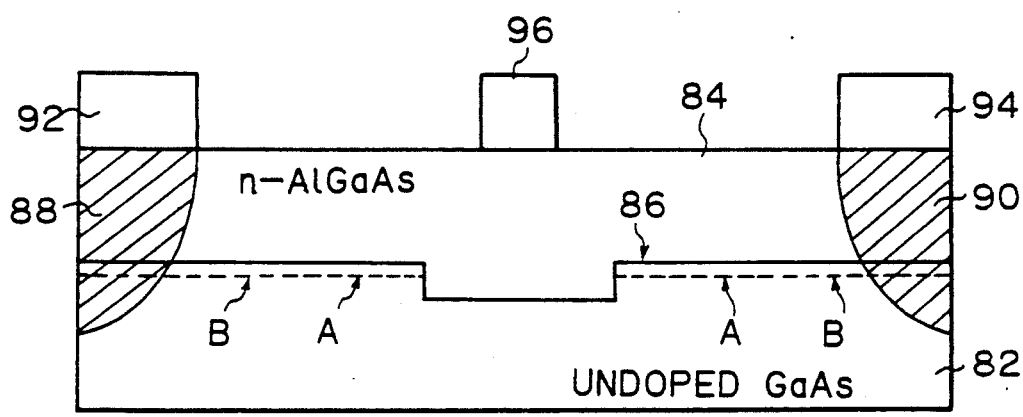
FIG. 24a is a schematic sectional view taken along the line E—E of FIG. 23.
Figure 24B:
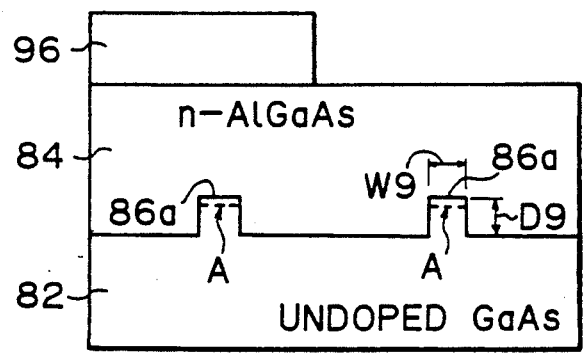
FIG. 24b is a schematic sectional view taken along the line F—F of FIG. 23.

As shown in FIG. 23, an n-type AlGaAs layer 84 is epitaxially deposited on an undoped GaAs layer 82 to form a heterojunction and a concave portion 86 of the AlGaAs layer 84 (i.e., a convex portion of the GaAs layer 82). The concave portion 86 consists of a ring part 86a, two lead parts 86b, and two pad parts 86c; the lead parts 86b diametrically extend from the ring part 86a to connect the pad parts 86c, respectively. Ohmic electrode regions 88 and 90 are formed in the layers 84 and 82 and reach the layer 82 at the pad parts 86c from the top surface of the layer 84, respectively. Ohmic electrodes 92 and 94 are formed, respectively, on the regions 88 and 90, and a gate electrode 96 with a Schottky junction is formed on the n-type AlGaAs layer 84 above a half of the ring part 86a, as shown in FIG. 24b. In this case, the ring part 86a with the two leads 86b diametrically extended on the concave portion 86 of the n-type AlGaAs layer 84 at the heterojunction interface is utilized as a pass through which an electron wave flows in the AB effect device.

Where a predetermined bias voltage is applied across the source electrode 92 and the drain electrode 94, the electron wave from the source electrode region 88 flows through the lead part 86b and is divided into two portions at the inlet of the ring part 86a, and further flows through the halves of the ring parts 86a, respectively, and merge again at the outlet of the ring part. When a voltage is applied to the gate electrode 96 above one of the ring halves, to apply a scalar potential to the half ring pass, the phase of the electron wave flowing through this pass is shifted to generate a phase difference between the two electron wave portions passing through the halves of the ring parts 86a respectively, and therefore, the two electron wave portions merge to cause the interference effect.

Moreover, the width W9 and the depth D9 of the concave portion 86 (ring part 86a and lead parts 86b) are suitably controlled to generate the quasi-one dimensional electron gas "A" in the narrow stripe portion 86, and thus the electron movement passing the parts 86a and 86b is limited in the direction parallel to the heterojunction interface, with the result that the electrons are wave-functionally confined. Accordingly, the gap between the electron energy levels is enlarged, and a single transverse-mode of the electron wave is obtained. Therefore, it is possible to utilize a sufficiently large interference effect whereby a variation of the conductance is increased. According to the ninth embodiment, the control of the scalar potential due to the gate voltage can enlarge the conductance variation to realize a device operating on the basis of the AB effect.

It is possible to arrange a pair of electromagnets above and under the ring part, to control the magnetic flux through the inside of the ring part for the control of the phase of the electron wave flowing through the two passes of the ring part, instead of the application of the controlled scalar potential by using the gate electrode in the above-mentioned ninth embodiment.

It will be obvious that the present invention is not restricted to the above-mentioned embodiments and that many variations are possible for persons skilled in the art without departing from the scope of the invention. For example, a buffer (spacer) thin layer of an undoped compound semiconductor having the same composition as that of the first compound semiconductor layer may be formed between the first and second compound semiconductor layers.

I claim:

1. A heterojunction semiconductor device, comprising:
   a first compound semiconductor layer and a second compound semiconductor layer having an electron affinity different from that of said first compound semiconductor layer, said first and second compound semiconductor layers forming a heterojunction interface therebetween, said first compound semiconductor layer being doped with donor impurities and having an energy at the conduction band bottom thereof higher than that of said second compound semiconductor layer,
   wherein said first compound semiconductor layer comprises at least one concave groove portion having a rectangular cross section at the heterojunction interface, and
   wherein said second compound semiconductor layer comprises at least one convex projection portion corresponding to said concave groove portion, and
   two electrode regions provided in said first and second semiconductor layers outside of said concave groove portion.

2. A heterojunction semiconductor device according to claim 1, wherein a quasi-one dimensional electron gas appears in the convex projection portion of said second compound semiconductor layer.

3. A heterojunction semiconductor device according to claim 1, wherein said first compound semiconductor layer is formed of AlGaAs and doped with the donor impurities and said second compound semiconductor layer is formed of an undoped GaAs.

4. A heterojunction semiconductor device according to claim 1, wherein said first compound semiconductor layer is formed of AlInAs doped with the donor impurities and said second compound semiconductor layer is formed of an undoped GaInAs.

5. A heterojunction semiconductor device according to claim 1, wherein said first compound semiconductor layer comprises a plurality of said concave groove portions forming narrow stripe concave groove portions at regular intervals in one direction at said heterojunction interface and providing minibands of energy for electrons accumulated in said convex projection portions of said second compound semiconductor layer, the minibands being parallel with a main interface of the heterojunction interface.

6. A heterojunction semiconductor device according to claim 5,
   wherein said convex projection portions of said second compound semiconductor layer having the minibands of energy for electrons serve as a channel region, and
   wherein said heterojunction semiconductor device further comprises a source electrode and a drain electrode formed at opposing end portions of said channel region, and a gate electrode formed on said first semiconductor layer above said channel region.

7. A heterojunction semiconductor device according to claim 5,
   wherein said convex projection portion of said second compound semiconductor layer having the minibands of energy for electron serves as an active region,
   wherein said heterojunction semiconductor device further comprises a third compound semiconductor layer doped with acceptor impurities and formed below said active region, and
   wherein said heterojunction semiconductor device comprises an n-side electrode formed on said first semiconductor layer above said active region and a p-side electrode formed on said third compound semiconductor layer.

8. A heterojunction semiconductor device according to claim 1, wherein said first semiconductor layer comprises a plurality of said concave portions formed as concave quantum boxes, said concave quantum boxes being arranged at regular intervals in two perpendicular directions at said heterojunction interface to form minibands of energy for electrons accumulated in the convex projection portions of said second compound semiconductor layer, the minibands being parallel with a main interface of the heterojunction interface.

9. A heterojunction semiconductor device according to claim 8,
wherein said convex projection portions of said second compound semiconductor layer having the minibands of energy for electrons serve as a channel region, and
wherein said heterojunction semiconductor device further comprises a source electrode and a drain electrode formed at opposing end portions of said channel region, and a gate electrode formed on said first semiconductor layer above said channel region.

10. A heterojunction semiconductor device according to claim 8,
wherein said convex projection portions of said second compound semiconductor layer having the minibands of energy for electrons serve as an active region,
wherein said heterojunction semiconductor device further comprises a third compound semiconductor layer doped with acceptor impurities and formed below said active region, and
wherein said heterojunction semiconductor device comprises an n-side electrode formed on said first semiconductor layer above said active region and a p-side electrode formed on said third compound semiconductor layer.

11. A heterojunction semiconductor device, comprising:
a first compound semiconductor layer and a second compound semiconductor layer having an electron affinity different from that of said first compound semiconductor layer, said first and second compound semiconductor layers forming a heterojunction interface therebetween, said first compound semiconductor layer being doped with donor impurities and having an energy at the conduction band bottom thereof higher than that of said second compound semiconductor layer,
wherein said first semiconductor layer comprises a concave groove portion having a rectangular cross section at the heterojunction interface having a ring shape with two leads diametrically positioned thereon, and
wherein said second semiconductor layer comprises a convex projection portion corresponding to said concave groove portion,
a source electrode and a drain electrode formed at an end portion of each of said two leads, respectively, and
controlling means for controlling phases of two electron waves divided by the ring shape.

12. A heterojunction semiconductor device according to claim 11,
wherein said ring shape has two semicircular passes, and
wherein said controlling means comprises a gate electrode formed on said first compound semiconductor layer above one of the two semicircular passes.

* * * * *

UNITED STATES PATENT AND TRADEMARK OFFICE
CERTIFICATE OF CORRECTION

PATENT NO. : 5,198,879          Page 1 of 2

DATED : March 30, 1993

INVENTOR(S) : Toshio OHSHIMA

It is certified that error appears in the above-indentified patent and that said Letters Patent is hereby corrected as shown below:

| | | | |
|---|---|---|---|
| * | TITLE PAGE - [73] | | change "Kanagawa" to --Kawasaki--. |
| * | Col. 3, | line 16, | change "an" to --a--; |
| * | | line 21, | change "an" to --a--; |
| * | | line 45, | change "twodimensions" to --two dimensions--. |
| * | Col. 5, | line 68, | change "vias" to --bias--. |
| * | Col. 6, | line 13 & line 14, | change "quasi-one dimensional" to --quasi-one-dimensional--; |
| * | | line 53, | after "view" insert --of--. |
| | Col. 7, | line 13 & line 14, | change "hetero-junction" to --heterojunction--; |
| | | line 39, | after "intensity" insert --at these sides--. |
| | Col. 8, | line 46, | after "intensity" insert --at these sides--; |
| | | line 55, | change "W1" to --W2--. |
| * | Col. 9, | line 4, | before "resonant" insert --(--; |
| * | | line 15, | change "an" to --a--. |

UNITED STATES PATENT AND TRADEMARK OFFICE
CERTIFICATE OF CORRECTION

PATENT NO. : 5,198,879
DATED : March 30, 1993
INVENTOR(S) : Toshio OHSHIMA

It is certified that error appears in the above-indentified patent and that said Letters Patent is hereby corrected as shown below:

| | | | |
|---|---|---|---|
| * | Col. 11, | line 32, | change "quasi-one dimensional" to --quasi-one-dimensional--; |
| * | | line 62, | change "sufficient" to --sufficiently--. |
| * | Col. 12, | line 55, | change "with" to --width--. |
| * | Col. 13, | line 41, | delete "a". |
| * | Col. 15, | line 22, | change "quasi-one dimensional" to --quasi-one-dimensional--. |
| * | Col. 16, | line 26, | change "quasi-one dimensional" to --quasi-one-dimensional--. |

Signed and Sealed this

Seventeenth Day of May, 1994

Attest:

BRUCE LEHMAN

*Attesting Officer*   *Commissioner of Patents and Trademarks*